Dec. 29, 1970 W. S. BOYLE 3,551,213
GEOMETRICALLY SELECTIVE ION BOMBARDMENT BY MEANS
OF THE PHOTOELECTRIC EFFECT
Filed Sept. 4, 1968
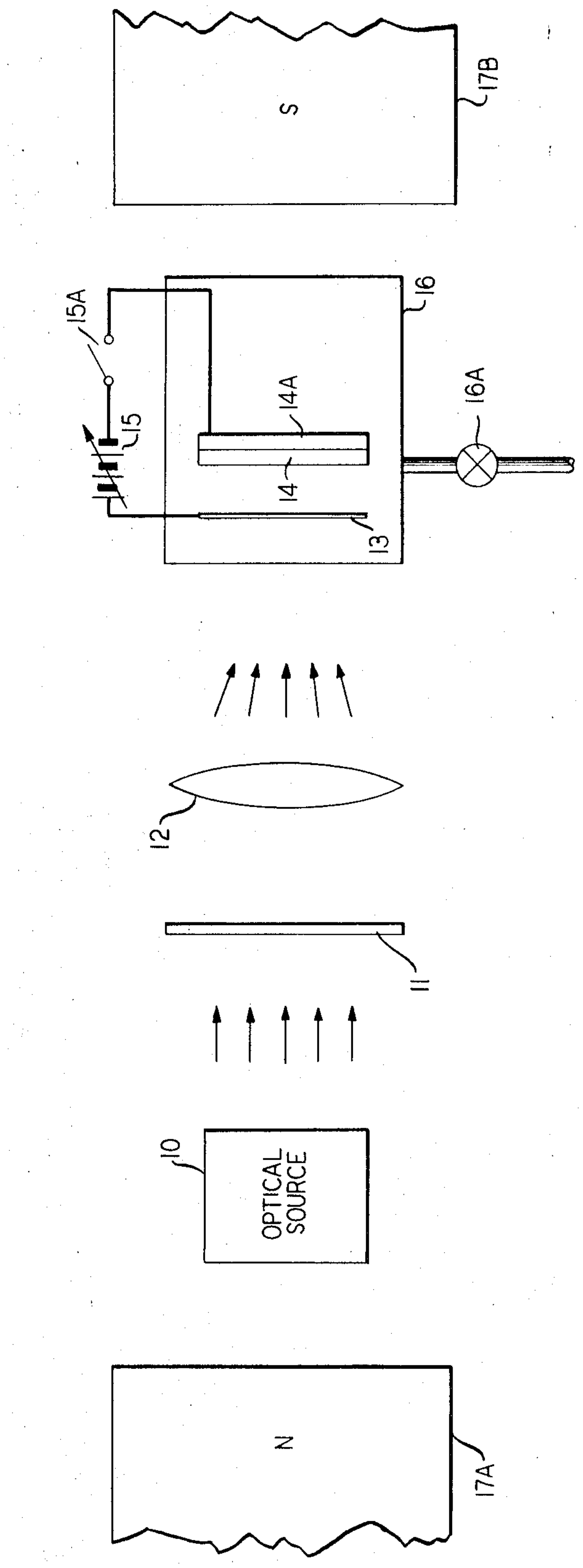
INVENTOR
W. S. BOYLE
BY Arthur J. Torsiglieri
ATTORNEY United States Patent Office 3,551,213

Patented Dec. 29, 1970

3,551,213

GEOMETRICALLY SELECTIVE ION BOMBARDMENT BY MEANS OF THE PHOTOELECTRIC EFFECT

Willard S. Boyle, Summit, N.J., assignor to Bell Telephone Laboratories, Incorporated, Murray Hill and Berkeley Heights, N.J., a corporation of New York Filed Sept. 4, 1968, Ser. No. 757,226
Int. Cl. H01l 7/54
U.S. Cl. 148—1.5 11 Claims

ABSTRACT OF THE DISCLOSURE

Geometrically selective ion bombardment of the surface of a target body, such as a semiconductor, is accomplished by means of the photoelectric effect. The body is placed in a gas containing the desired atomic specie, while ultraviolet radiation is focussed upon the surface of the target body in accordance with a desired pattern of bombardment. Photoelectrons are emitted from the surface and are accelerated away from the surface by an applied electric field. Finally, the photoelectrons ionize the gas, and the ions created thereby are accelerated back towards the surface of the target body.

BACKGROUND OF THE INVENTION

This invention relates to a method of selectively bombarding the surface of a target of semiconductor material in accordance with a predetermined pattern, either for selectively implanting significant impurities therein, or for selectively depositing metallic coatings thereon, or for selective removal ("back-sputtering") of material thereon; suitable for semiconductor devices and integrated circuits. Significant impurities include those which control conductivity, minority carrier lifetime, or other properties of the semiconductor which are influenced by impurities.

In order to dope semiconductors with conductivity type determining impurities in a predetermined geometrical pattern, diffusion of impurities into semiconductors through openings in suitable masks have been used in the prior art. However, such techniques involve complex, time consuming multiple steps to form the required masks. Likewise, such techniques depend upon the forces of thermodynamic equilibrium for the determination of the ultimate doping concentration of impurities attained; therefore, these techniques are limited in the choice of doping impurity, as well as the magnitude and shape of the resulting impurity profile in the semiconductor. By contrast, the method of impurity implantation by ion bombardment can be operated under conditions further removed from thermal equilibrium, and therefore offers greater flexibility. On the other hand, the method of selective ion bombardment by focusing an ion beam of the desired impurities directed at the semiconductor surface and "writing" on selected portions of the surface, suffers from slow speed and requires elaborate equipment. Likewise, in depositing metal layers in a geometrically selective pattern upon the surface of a semiconductive body, multiple steps of masking and etching are required. Therefore, it is desirable to have a speedy, geometrically controllable, and simple method for direct ion bombardment of semiconductor targets in accordance with a predetermined desired geometrical pattern, either for implantation or deposition purposes.

SUMMARY OF THE INVENTION

In accordance with this invention, an optical (preferably ultraviolet light) pattern is used to delineate the geometrical pattern of the regions of the semiconductor target into which the conductivity type determining impurities are to be implanted or to delineate those areas upon which a metallic coating is to be deposited on a substrate for interconnections. A mercury lamp may be used as the optical source, the radiation from which is focused on the surface of the target semiconductor or other substrate, in accordance with the desired pattern. An electric field is established in a direction toward the target surface. A gas containing the desired atoms or atomic nuclei to be deposited or implanted is introduced in the vicinity of the target surface while the optical radiation is focused on the target surface itself in the desired pattern. Thereby photoelectrons are emitted from the surface according to this pattern. Being negatively charged, these electrons are accelerated away from the target by the electric field and thereby gain energy as they move into the gas. Collision of these electrons with molecules of the gas create ions which, being positively charged, are accelerated by the electric field back towards the target.

In cases where it is desired merely to deposit atoms of these ions in a geometrically controllable desired patterned layer on the surface of the target, and in cases where it is desired to use these ions to back-sputter the target in a desired pattern, the voltage drop experienced by the accelerated ion through the electric field is made relatively quite low. In cases of semiconductive targets into which the ions are desired to be implanted as significant impurities to determine the electrical conductivity, the voltage drop experienced by the accelerated ions through the electric field is made quite high.

Details of this invention can best be understood by consideration of the following specific examples illustrating the invention, when read in conjunction with the drawings in which the figure is a diagram of apparatus useful in carrying out this invention. It should be understood that the diagram is not to scale, for purposes of clarity; in particular, the separation between the grid 13 and the target 14 is in practice much smaller than their lateral dimensions.

EXAMPLE I

Patterned ion implantation

Referring to the figure, radiation from an optical source 10, such as a mercury lamp for example, illuminates a patterned mask 11. This mask 11 contains opaque and diffusely transparent (translucent) areas, the translucent areas being in a configuration representative of the ultimately desired pattern of conductivity type determining impurity ions to be implanted into the front surface of the semiconductor wafer target 14. The optical lens 12 serves to focus the pattern of the opaque and transparent areas of the mask on the front surface of the wafer target 14, in the desired pattern configuration. Advantageously, this front surface of the target 14 is chemically cleaned by methods known in the art, just before the ion implantation process. The electrode grid 13 is substantially transparent to the optical radiation and is used to establish an electric field in the region between grid 13 itself and the semiconductor wafer target 14, by means of the electrical connections from the battery 15 with a switch 15A, through the walls of the chamber 16, to the grid 13 and to an electrode layer 14A. This layer 14A is made of electrically conducting material and is situated adjacent the rear surface of the target 14, as shown in the figure. The chamber 16, in which are mounted the grid 13 and the semiconductor target 14, has a valve 16A through which the chamber 16 may be evacuated of undesired impurities. Likewise, through this valve 16A are introduced the molecules containing the desired impurities to be selectively implanted into the semiconductor 14. The wall of the chamber 16 facing the lens 12 is transparent to the optical radiation, as is the grid 13. The target 14 is heated by any of the well-known means (not shown), such as induction heating. Thus, target 14 is maintained at a uniform elevated temperature typically between 400° C. and 900° C. during and for a time after bombardment, as known in the art, to ensure that implanted ions take on substitutional positions in the lattice of the target 14. However, this heating may be performed after the ion bombardment has terminated, if desired. Advantageously, an axial magnetic field is established by pole pieces 17A and 17B to control sideways diffusion of photoelectrons created by the impinging optical beam on the semiconductor wafer target 14, as well as sideways diffusion of the ions created by collisions on the photoelectrons.

The voltage supplied by the battery 15 to the grid 13 and wafer target 14 is between about 10 and 100 kilovolt, typically 50 kilovolt. This voltage may even be higher than 100 kilovolt, depending upon the desired depth of penetration into the target 14, as known in the art. The distance between the grid 13 and the front surface of the wafer 14 is typically about 1 millimeter. These values are in any event selected to prevent field emission breakdown. The pressure, due to the gas containing desired impurities in the chamber 16, advantageously is established of the order of $10^{-3}$ centimeter of mercury ($10^{-2}$ torr), in order to provide about one ionizing collision of each photoelectron after emission by the surface of the wafer 14 until collected by the grid 13.

Examples of gases introduced in the chamber 16 and suitable for implantation of donors into silicon or germanium are phosphorus pentoxide and phosphorus pentafluoride. Examples of gases suitable for implantation of acceptors into silicon or germanium are boron trichloride and boron tribromide. More generally, for targets 14 of Group I–V semiconductors, gases containing Group III atoms typically may be used for implantation of acceptors, as known in the art; and gases containing Group V atoms typically may be used for implantation of donors, also as known in the art. Other atoms may be used for other types of semiconductors, as known in the art; for example, a gas containing zinc for implantation of acceptors into gallium arsenide.

Typically, a mercury vapor lamp may be used for the optical source 11, as known in the art. In an implantation into the wafer target 14 where, for example, about $10^{15}$ implanted ions per square centimeter is desired (corresponding to $10^{19}$ implanted ions per cubic centimeter to a depth of one micron), an optical intensity of approximately $10^{17}$ photons per square centimeter at the illuminated portions of the target 14 is required from the optical source 11. This takes into account the photoelectric coefficient and ionization efficiency of the photoelectrons. This is equivalent, for example, to 20 milliwatts of optical radiation per square centimeter in the spectral range of 6 e.v. (2000 angstroms) for a three second exposure of the wafer target 14 at those portions where ion implantation is desired. In any event, it is important that the optical source 10 emit photons of sufficiently small wavelength to exceed the threshold for photoelectric emission (work function) by the target 14. It should be noted that, as known in the art, in case of the impurity nitrogen implanted into a target 14 of silicon, some formation of dielectric (silicon nitride compounds) may automatically occur on the surface, especially at large doses of impurity implantation.

To implant the ions of the desired impurity into the front surface of the semiconductor wafer target 14, the wafer is chemically cleaned and placed in the chamber 16. By means of valve 16A, the chamber 16 is evacuated to remove undesired impurities. If desired, the target 14 may also be cleaned further in situ after the chamber 16 is evacuated. Then the gas containing the atoms of the ions to be implanted is introduced into the chamber 16 to the prescribed pressure. The patterned mask 11 and lens 12 are mounted in place to focus the pattern on the target 14. The electric field, directed towards the wafer target 14, is established by closing the switch 15A; thereby electrical connection is completed of the positive terminal of the battery 15 to the grid 13, and the negative terminal to the electrode layer 14A. Radiation from the optical source 10 is incident on the mask 11 and the resulting pattern is focused by the lens 12 on the surface of the wafer target 14. Thereby photoelectrons are emitted from the surface of the wafer at the illuminated portions.

The emitted photoelectrons are then accelerated by the electric field toward the grid 13, and a substantial number of these electrons thereby ionize some of the atoms of the desired impurity, previously introduced in gaseous form, into the chamber 16. In turn, these ionized atoms, being positively charged, are accelerated back towards and bombard the wafer 14 and are implanted therein. The pattern of this implantation will be substantially identical to the pattern of illumination of the surface of the wafer target 14 by the source 10 as defined by the mask 11 focused by the lens 12 upon this target 14. During and/or after this bombardment, the wafer target 14 is kept at a uniform elevated temperature, typically between 400 C. and 900° C. as known in the art, to ensure that the implanted ions take on substitutional positions in the lattice of the targe 14, as mentioned previously.

EXAMPLE II

Patterned deposition of a metal

Referring to the figure, radiation from an optical source 10, such as a mercury lamp for example, illuminates a patterned mask 11. This mask 11 contains opaque and diffusely transparent (translucent) areas, the translucent areas being in a configuration representative of the ultimately desired pattern of metal to be deposited upon a target 14. This target may be made of a semiconductor or other wafer substrate upon which it is desired to deposit the metal. Radiation from an optical source 10, such as a mercury lamp for example, illuminates a patterned mask 11. This mask 11 contains opaque and diffusely transparent (translucent) areas, the translucent areas being in a configuration representative of the ultimately desired pattern of metal to be deposited upon the front surface of the semiconductor wafer target 14. The optical lens 12 serves to focus the pattern of the opaque and transparent areas of the mask on the front surface of the wafer target 14, in this desired pattern configuration. Advantagesouly, this front surface of the target 14 is chemically cleaned by methods known in the art, just before the deposition process and/or in situ if desired. The electrode grid 13 is transparent to the optical radiation and is used to establish an electric field in the region between grid 13 itself and the semiconductor wafer target 14, by means of the electrical connections from the battery 15 with a switch 15A, through the walls of the chamber 16, to the grid 13 and to an elecrode layer 14A. This layer 14A is made of electrically conducting material, and is situated adjacent the rear surface of the target 14, as shown in the figure. The chamber 16, in which are mounted the grid 13 and the semiconductor target 14, has a valve 16A through which the chamber 16 may be evacuated of undesired impurities. Likewise, through this valve 16A are introduced the molecules containing the atoms of the desired metal to be selectively deposited onto the target 14. The wall of the chamber 16 facing the lens 12 is transparent to the optical radiation, as is the grid 13. The target 14 may be at room temperature. Advantageously, an axial magnetic field is established by pole pieces 17A and 17B to control sideways diffusion of photoelectrons created by the impinging optical beam on the semiconductor wafer target 14, as well as sideways diffusion of the ions created by collisions on the photoelectrons.

Typically, the voltage supplied by the battery 15 to the grid 13 and wafer target 14 is between about 100 and 500 volts, typically about 200 volts. The distance between the grid 13 and the front surface of the wafer 14 is typically about 1 millimeter. These values are in any event selected to prevent field emission breakdown and minimize back-sputtering. The pressure, due to the gas containing atoms of the desired metal to be deposited, is established of the order of $10^{-4}$ centimeter of mercury ($10^{-3}$ torr), in order to ensure approximately one ionizing collision of each photoelectron after emission by, the surface of the wafer 14 before collected by the grid 13. Typically, for the deposition of molybdenum, this gas may be selected to contain molybdenum tetrachloride; and for the deposition of osmium, osmium tetrachloride.

The optical source 11 is, for example, a mercury vapor lamp. The intensity of the optical radiation incident upon the selectively illuminated portions of the target 14 is adjusted, by known means, according to the rate of deposition desired; for example, an intensity at the illuminated portion of the target 14 of the order of 10 milliwatt of optical radiation per square cm. is useful in the spectral range of 6. e.v. (2000 A.). In any event, it is important that the optical source 10 emit photons of sufficiently small wavelengths to exceed the threshold for photoelectron emission ("work function") of the target 14.

To deposit the desired metal selectively upon the front surface of the wafer target 14, the surface is chemically cleaned and placed in the chamber 16. By means of valve 16A, the chamber 16 is evacuated to remove undesired impurities. If desired, the target 14 may also be cleaned further in situ after the chamber 16 is evacuated. Then the gas containing the atoms of the metal to be deposited is introduced into the chamber 16 to the prescribed pressure. The patterned mask 11 and lens 12 are mounted in place to focus the pattern on the target 14. The electric field, directed towards the wafer target 14, is established by closing the switch 15A, thereby electrical connection is completed of the positive terminal of the battery 15 to the grid 13, and the negative terminal to the electrode layer 14A. Radiation from the optical source 10 is incident on the mask 11, and the resulting pattern is focused by the lens 12 on the surface of the wafer target 14. Thereby photoelectrons are emitted from the surface of the wafer at the illuminated portions thereof.

The emitted photoelectrons are then accelerated by the electric field toward the grid 13, and a substantial number of these electrons thereby ionize some of the atoms of the desired metal previously introduced in gaseous form into the chamber 16. In turn, these ionized metal atoms, being positively charged, are accelerated back towards the wafer 14 and are incident upon the front surface thereof. Thereby, a metallic deposit results. The pattern of deposition will be substantially identical to the pattern of illumination of the surface of the wafer target 14 by the source 10 as defined by the mask 11 as focused by the lens 12 upon this target 14. During bombardment, the wafer target 14 is advantageously kept at room temperature.

EXAMPLE III

Patterned back-sputtering

Referring to the figure, radiation from an optical source 10, such as a mercury lamp for example, illuminates a patterned mask 11. This mask 11 contains opaque and diffusely transparent (translucent) areas, the translucent areas being in a configuration representative of the ultimately desired pattern of back-sputtering removal of atoms previously present on the front surface of the semi-conductor wafer target 14. The optical lens 12 serves to focus the pattern of the opaque and transparent areas of the mask on the front surface of the wafer target 14, in the desired pattern configuration of such "back-sputtering." The electrode grid 13 is substantially transparent to the optical radiation and is used to establish an electric field in the region between grid 13 itself and the semiconductor wafer target 14, by means of the electrical connections from the battery 15 with a switch 15A, through the walls of the chamber 16, to the grid 13 and to an electrode layer 14A. This layer 14A is made of electrically conducting material and is situated adjacent the rear surface of the target 14, as shown in the figure. The chamber 16, in which are mounted the grid 13 and the semiconductor target 14, has a valve 16A through which the chamber 16 may be evacuated of undesired impurities. Likewise, through this valve 16A are introduced the molecules containing the sputtering gas, advantageously an inert gas such as argon. The wall of the chamber 16 facing the lens 12 is transparent to the optical radiation, as is the grid 13. The target 14 is typically at room temperature, at least initially. Advantageously, an axial magnetic field is established by pole pieces 17A and 17B to control sideways diffusion of photoelectrons created by the impinging optical beam on the semiconductor wafer target 14, as well as sideways diffusion of the ions created by collisions on the photoelectrons. The voltage supplied by the battery 15 to the grid 13 and wafer target 14 is between about 200 and 1000 volts, typically 400 volts. The distance between the grid 13 and the front surface of the wafer 14 is typically about 1 millimeter. These values are in any event selected to prevent field emission breakdown or normal gas breakdown. The pressure, due to the gas containing desired impurities in the chamber 16, advantageously is established of the order of $10^{-4}$ centimeter of mercury ($10^{-3}$ torr) in order to provide about one ionizing collision of each photoelectron after emission by the surface of the wafer 14 until collected by the grid 13.

The optical source 11 is, for example, a mercury vapor lamp. The intensity of the optical radiation incident upon the selectively illuminated portions of the target 14 is adjusted, by known means, according to the rate of back-sputtering desired; for example, an intensity at the illuminated portions of the target 14 of the order of 10 milliwatts of optical radiation per square cm. is useful in the spectral range of 6 e.v. (2000 A.). In any event, it is important that the optical source 10 emit photons of sufficiently small wavelengths to exceed the threshold for photoelectron emission ("work function") of the target 14.

To back-sputter the front surface of the semiconductor wafer target 14, the wafer is in the chamber 16. By means of valve 16A, the chamber 16 is evacuated to remove undesired impurities. Then the gas containing the inert argon atoms is introduced into the chamber 16 to the prescribed pressure. The patterned mask 11 and lens 12 are mounted in place to focus the pattern on the target 14. The electric field, directed towards the wafer target 14, is established by closing the switch 15A; thereby electrical connection is completed of the positive terminal of the battery 15 to the grid 13, and the negative terminal to the electrode layer 14A. Radiation from the optical source 10 is incident on the mask 11 and the resulting pattern is focused by the lens 12 on the surface of the wafer target 14. Thereby photoelectrons are emitted from the surface of the wafer at the illuminated portions.

The emitted photoelectrons are then accelerated by the electric field toward the grid 13, and a substantial number of these electrons thereby ionize some of the atoms of the inert argon gas, previously introduced into the chamber 16. In turn, these ionized argon atoms, being positively charged, are accelerated back towards and bombard the wafer 14 and are implanted therein. The pattern of this implantation will be substantially identical to the pattern of illumination of the surface of the wafer target 14 by the source 10 as defined by the mask 11 focused by the lens 12 upon this target 14.

Altohugh this invention has been described in terms of specific embodiments, it should be obvious to those skilled in the art that many modifications thereof are possible within the scope of the invention.

What is claimed is:

1. The method of bombarding the surface of a body with electrically positive ions of predetermined type according to a geometrically selective pattern, comprising the steps of:

(a) placing the body in a gas containing atoms of said predetermined type;

(b) establishing an electric field directed toward the surface of the body; and (c) focusing a beam of electromagnetic radiation on the surface of the body in accordance with the geometrically selective pattern, whereby photoelectrons are emitted by the said body in accordance with said pattern, and whereby said photoelectrons ionize said gas, thereby creating positive ions which are accelerated toward the body in accordance with said pattern.

2. The method of claim 1 in which the body is semiconductive.

3. The method of claim 2 in which the electric field is sufficient to cause the ions to be implanted into the semiconductive body.

4. The method of claim 3 with the added step of heating the semiconductive body to a sufficiently high temperature for a sufficiently long time to cause the implanted ions to contribute to the electrical conductivity of the semiconductive body.

5. The method of claim 3 in which the gas contains phosphorus pentoxide and the semiconductive body is in the group consisting of silicon and germanium.

6. The method of claim 3 in which the gas contains boron trioxide and the semiconductive body is in the group consisting of silicon and germanium.

7. The method of claim 2 in which the gas contains atomic nuclei of a metal to be selectively deposited on the body, and the electric field is sufficient to deposit the metal on the semiconductive body.

8. The method of claim 2 in which the gas contains molybdenum tetrachloride.

9. The method of claim 2 in which the gas contains osmium tetrachloride.

10. The method of claim 1 in which the gas is essentially an inert gas, and the electric field is sufficient to accelerate the positive ions of said gas toward the body for back-sputtering the surface of the body in accordance with said pattern.

11. The method of claim 10 in which the gas is essentially argon.

References Cited

UNITED STATES PATENTS 3,390,019 6/1968 Manchester ---------- 148—1.5

L. DEWAYNE RUTLEDGE, Primary Examiner

R. A. LESTER, Assistant Examiner

U.S. Cl. X.R.

29—576, 584; 117—93.3; 204—164, 192; 250—49.5; 346—74